(12) United States Patent
Temleitner et al.

(10) Patent No.: US 10,090,827 B2
(45) Date of Patent: Oct. 2, 2018

(54) PULSED SEMI-DYNAMIC FAST FLIP-FLOP WITH SCAN

(71) Applicant: STMicroelectronics (Crolles 2) SAS, Crolles (FR)

(72) Inventors: Patrik Temleitner, Le Cannet (FR); Fady Abouzeid, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/414,419

(22) Filed: Jan. 24, 2017

(65) Prior Publication Data
US 2018/0212596 A1    Jul. 26, 2018

(51) Int. Cl.
H03K 3/356     (2006.01)
H03K 19/21     (2006.01)

(52) U.S. Cl.
CPC ..... *H03K 3/356165* (2013.01); *H03K 19/215* (2013.01)

(58) Field of Classification Search
CPC .... G01R 31/318594; G01R 31/318541; G01R 31/318552; H03K 3/356113; H03K 5/05
USPC ........................................................ 327/211
See application file for complete search history.

(56) References Cited

U.S. PATENT DOCUMENTS

| | | | | |
|---|---|---|---|---|
| 6,195,776 B1* | 2/2001 | Ruiz | ............... | G01R 31/31725 703/22 |
| 8,451,040 B2* | 5/2013 | Lee | ....................... | H03K 3/012 326/95 |
| 2007/0114603 A1* | 5/2007 | Inagaki | ............ | H01L 21/28123 257/332 |
| 2007/0182854 A1* | 8/2007 | Chen | ........................ | G09G 5/34 348/561 |
| 2011/0141098 A1* | 6/2011 | Yaguma | ............... | G09G 3/3688 345/212 |
| 2012/0119784 A1* | 5/2012 | Lee | ..................... | H03K 19/0963 326/95 |
| 2015/0058690 A1* | 2/2015 | Dia | ................ | G01R 31/318594 714/731 |
| 2015/0207496 A1* | 7/2015 | Seningen | ......... | H03K 3/356104 327/210 |

OTHER PUBLICATIONS

2015 International Solid-State Circuits Conference, Session 23, Low-Power SocS, 2015, 97 pages.
Partovi et al., "Flow-Through Latch and Edge-Triggered Flip-flop Hybrid Elements," Paper FA 8.5, ISSCC96 / Session 8 / Digital Clocks and Latches, pp. 138-139, 1996.

* cited by examiner

*Primary Examiner* — Patrick Chen
(74) *Attorney, Agent, or Firm* — Seed IP Law Group LLP

(57) ABSTRACT

A flip-flop includes a pulse-generator and a pulse-controlled latch. The pulse generator includes a first inverter to invert a clock signal, a second inverter to invert the inverted clock signal to generate a delayed clock signal, and a NOR gate having a first input coupled to an output of the first inverter, a second input coupled to the output of the second inverter, and an output, which, in operation, provides a pulse signal in response to a rising edge of a received clock signal. The pulse-controlled latch circuit has a data input and is controlled by the pulse signal and the delayed clock signal. The flip-flop may include a multiplexer to select an input signal.

24 Claims, 7 Drawing Sheets

US 10,090,827 B2

PULSED SEMI-DYNAMIC FAST FLIP-FLOP WITH SCAN

BACKGROUND

Technical Field

The present disclosure generally relates to the field of flip-flops, such as integrated circuits including flip-flops. For example, integrated circuits including flip-flops for use in low-power, high performance applications, such as mobile applications.

Description of the Related Art

Integrated circuits may employ flip-flops, such as flip-flops to store data during operation of the integrated circuit, flip-flops included in scan chains of the integrated circuit, etc. For example, scan chains may be employed to load and unload data from flip-flops of an integrated circuit to initialize the integrated circuit, for testing purposes, etc.

BRIEF SUMMARY

In an embodiment, a device comprises: a pulse generator circuit including: a first inverter having an input coupled to a clock signal input node; a second inverter having an input coupled to an output of the first inverter and an output, which in operation, provides a delayed clock signal; and a NOR gate having a first input coupled to an output of the first inverter, a second input coupled to the output of the second inverter, and an output, which, in operation, provides a pulse signal in response to a rising edge of a clock signal received at the clock signal input node; and a pulse-controlled latch circuit including: a clock input coupled to the output of the second inverter; a pulse-signal input coupled to the output of the NOR gate; and a data input node. In an embodiment, the device comprises: a mode selection circuit comprising a multiplexer having a first input node, a second input node, a selection input node, and an output node coupled to the data input node of the pulse-controlled latch circuit, wherein, in operation, the multiplexer outputs at the output node a selected one of a signal received at the first input node and a signal received at the second input node based on a signal received at the selection input node. In an embodiment, the mode selection circuit comprises an inverter coupled between the output of the multiplexer and the data input node of the pulse-controlled latch circuit. In an embodiment, the pulse-controlled latch circuit comprises a first latch stack coupled between a supply node and a ground node and having: a first CMOS transistor having a gate coupled to the output of the second inverter; a second CMOS transistor having a gate coupled to the output of the NOR gate; a third CMOS transistor having a gate coupled to the data input node of the pulse-controlled latch circuit; and a first latch stack output node. In an embodiment, the first CMOS transistor is a PMOS transistor coupled between the supply node and the first latch stack output node, the second CMOS transistor is an NMOS transistor coupled between the first latch stack output node and the third CMOS transistor, and the third CMOS transistor is an NMOS transistor coupled between the second CMOS transistor and the ground node. In an embodiment, the pulse-controlled latch circuit comprises a pulse-controlled sampling circuit having a first inverter and a pulse-clocked inverter coupled in series to the output node of the first latch stack in a loop configuration. In an embodiment, the pulse-controlled latch circuit comprises a second latch stack coupled between the supply node and the ground node and having a first CMOS transistor having a gate coupled to the output node of the first latch stack, a second CMOS transistor having a gate coupled to the output of the second inverter of the pulse generator circuit, a third CMOS transistor having a gate coupled to the output node of the first latch stack, and a second latch stack output node. In an embodiment, the first CMOS transistor of the second latch stack is a PMOS transistor coupled between the supply node and the second latch stack output node, the second CMOS transistor of the second latch stack is an NMOS transistor coupled between the second latch stack output node and the third CMOS transistor of the second latch stack and the third CMOS transistor of the second latch stack is an NMOS transistor coupled between the second CMOS transistor of the second latch stack and the ground node. In an embodiment, the pulse-controlled latch circuit comprises a third latch stack coupled between the supply node and an intermediate node of the second latch stack and an inverter coupled between the output node of the second latch stack and an input node of the third latch stack, the third latch stack including a first CMOS transistor having a gate coupled to the input node of the third latch stack, a second CMOS transistor having a gate coupled to the output of the second inverter of the pulse generator circuit and a third CMOS transistor having a gate coupled to the input node of the third latch stack. In an embodiment, the first CMOS transistor of the third latch stack is a PMOS transistor coupled between the supply node and the second CMOS transistor of the third latch stack, the second CMOS transistor of the third latch stack is a PMOS transistor coupled between the first CMOS transistor of the third latch stack and the third CMOS transistor of the third latch stack and the third CMOS transistor of the third latch stack is an NMOS transistor coupled between the second CMOS transistor of the third latch stack and the intermediate node of the second latch stack. In an embodiment, the pulse-controlled latch circuit comprises an inverter coupled between the output node of the second latch stack and an output node of the pulse-controlled latch circuit. In an embodiment, the pulse generator circuit comprises a first plurality of CMOS transistors, the mode selection circuit comprises a second plurality of CMOS transistors, and the pulse-controlled latch circuit comprises a third plurality of CMOS transistors. In an embodiment, the signal received at the selection input node is a signal indicative of a scan mode of operation of the device.

In an embodiment, a system comprises: a plurality of flip-flops, each flip-flop of the plurality of flip-flops having: a pulse generator circuit including: a first inverter having an input coupled to a clock signal input node; a second inverter having an input coupled to an output of the first inverter and an output, which in operation, provides a delayed clock signal; and a NOR gate having a first input coupled to an output of the first inverter, a second input coupled to the output of the second inverter, and an output, which, in operation, provides a pulse signal in response to a rising edge of a clock signal received at the clock signal input node; and a pulse-controlled latch circuit including: a clock input coupled to the output of the second inverter; a pulse-signal input coupled to the output of the NOR gate; and a data input node. In an embodiment, at least one of the plurality of flip-flops comprises a mode selection circuit including a multiplexer having a first input node, a second input node, a selection input node, and an output node, wherein, in operation, the multiplexer outputs at the output node a selected one of a signal received at the first input node and a signal received at the second input node based on a signal received at the selection input node. In an embodiment, a mode selection circuit of one of the at least one of the plurality of flip-flops comprises an inverter coupled between the output of the multiplexer and the data-input of the pulse-controlled latch circuit. In an embodiment, the system comprises a scan chain including one or more of the at least one of the plurality of flip-flops. In an embodiment, the system comprises a processor core including one or more of the plurality of flip-flops. In an embodiment, the system comprises an integrated circuit including the plurality of flip-flops. In an embodiment, the system comprises one or more additional flip-flops.

In an embodiment, a method comprises: inverting, using a first inverter, a clock signal, generating an inverted clock signal; inverting, using a second inverter, the inverted clock signal, generating a delayed clock signal; applying, using a NOR gate, a logical NOR operation to the inverted clock signal and the delayed clock signal, generating a pulse signal; and controlling latching of a signal by a pulse-controlled latch circuit based on the delayed clock signal and the pulse signal. In an embodiment, the method comprises: selecting, using a multiplexer, one of a first input signal and a second input signal based on a mode selection signal, wherein the controlling latching comprises controlling latching of a signal corresponding to the selected one of the first input signal and the second input signal. In an embodiment, the method comprises inverting, using an inverter, the selected one of the first input signal and the second input signal, generating the signal corresponding to the selected one of the first input signal and the second input signal. In an embodiment, the signal corresponding to the selected one of the first input signal and the second input signal is equal to the selected one of the first input signal and the second input signal. In an embodiment, the mode selection signal indicates one of a data input mode of operation and a scan mode of operation.

DETAILED DESCRIPTION

Figure 1:
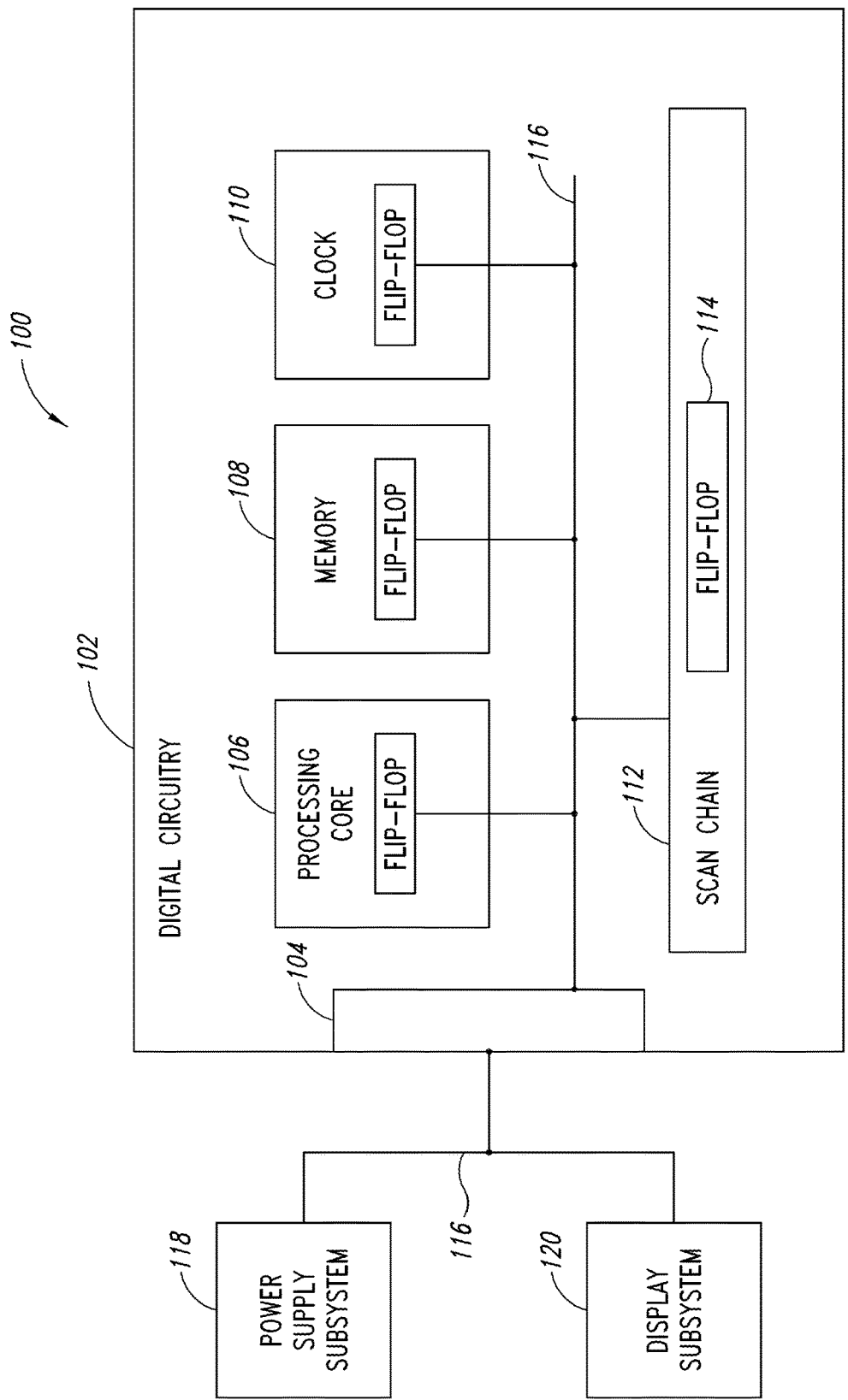
FIG. 1 is a functional block diagram of an embodiment of a system including digital circuitry including an embodiment of a flip-flop employing NOR-based pulse generation.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, integrated circuits, such as transistors, logic gates, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

Referring to FIG. 1, a system 100 comprises digital circuit or circuitry 102, such as an integrated circuit or portion thereof which in operation processes digital signals, such as one or more input digital signals, to produce one or more output signals. The input and output signals may typically be received and transmitted through one or more interfaces 104. The digital circuit 102 as illustrated comprises one or more processing cores 106, one or more memories 108, one or more clocks 110, and one or more scan chains 112 to load and unload data from components of the digital circuit 102, such as one or more flip-flops 114 of the digital circuit 102. At least one of the flip-flops includes at least one of a pulse generation circuit comprising a NOR gate and a scan selection circuit comprising a multiplexer (see, e.g., flip-flop 200, pulse generation circuit 202, NOR gate 210, scan selection circuit 204 and multiplexer 216 of FIG. 2). The digital circuit 102 also comprises one or more bus systems 116 to couple the various components of the system 100 together, such as one or more components of the digital circuit 102. The digital circuit 102 may comprise, for example, a CPU, a memory, a field programmable gate array, etc. While the components of the digital circuitry 102 are illustrated as separate blocks for ease of illustration, the one or more processing cores 106 may include one or more memories 108, and may typically include one or more discrete circuits, such as one or more flip-flops 114, etc., and various combinations thereof. Similarly, the one or more memories 108 may include one or more processing cores 106, and may typically include one or more discrete circuits, such as one or more flip-flops 114, etc., and various combinations thereof. The system 100 as illustrated also comprises a power supply subsystem 118 and a display subsystem 120, which may be, for example, a touch screen.

Figure 2:
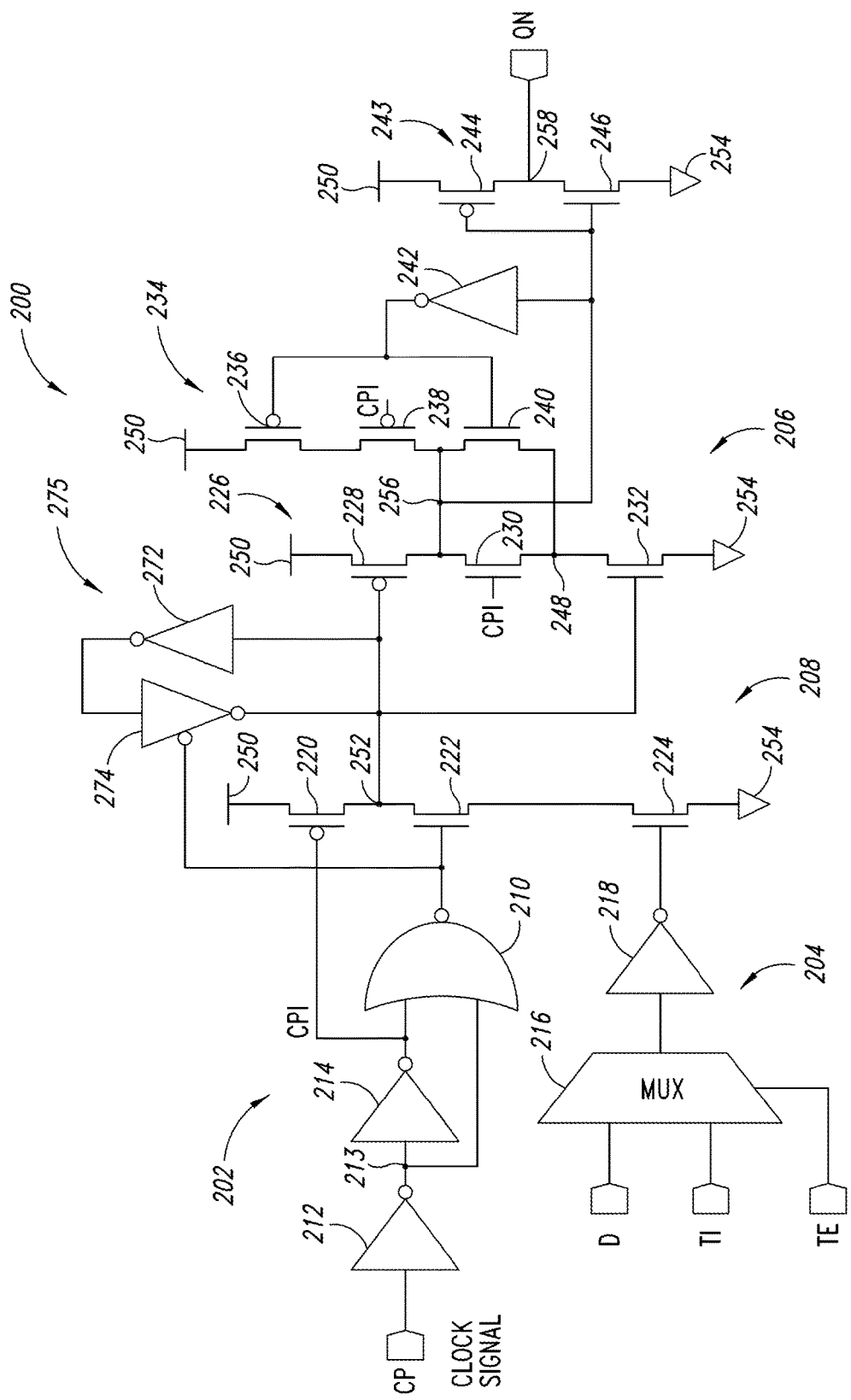
FIG. 2 is a functional block diagram of an embodiment of a flip-flop employing NOR-based pulse generation.

FIG. 2 illustrates an embodiment of a flip-flop 200 that may be employed, for example, in the system 100 of FIG. 1. The flip-flop 200 has a pulse generation circuit 202, a mode selection circuit 204, and latch circuitry 206, and may be implemented using complementary metal-oxide semiconductor field effect transistor (CMOS) technology.

The pulse generation circuit 202 has a NOR gate configuration, and as illustrated comprises a first inverter 212 and a second inverter 214 coupled together in series between a clock signal input and a first input of a NOR gate 210. An intermediate node 213 between the first inverter 212 and the second inverter 214 is coupled to a second input of the NOR gate 210. In operation, receipt of a rising edge of a clock signal at an input of the first inverter 212 generates a pulse at the output of the NOR gate 210. The output of the first inverter 212 and the output of the second inverter 214 are both low for a period of time after the rising edge of the clock signal is received, due to the delay of the second inverter 214, which causes the output of the NOR gate 210 to provide a high output pulse. A signal CPI at the output of the second inverter 214 follows an input clock signal CP received at the input of the first inverter 212 by a delay corresponding to a delay of the inverters 212, 214.

The mode selection circuit 204 of the flip-flop 200 comprises a multiplexer 216 and an optional inverter 218. The multiplexer 216 has a first input which in operation receives a signal D, which may be, for example, a data signal, such as a signal generated during normal operation of a digital circuit (see digital circuit 102 of FIG. 1) including one or more flip-flops 200. The multiplexer 216 has a second input which in operation receives a signal TI, which may be, for example, a test input signal of a scan mode of operation of a digital circuit (see digital circuit 102 of FIG. 1) including the flip-flop 200. The multiplexer 216 has a selection input which in operation receives a selection signal TE, which may be, for example, a test enable signal of a digital circuit (see digital circuit 102 of FIG. 1) including the flip-flop 200, a scan enable signal, etc. In response to the selection signal TE, the multiplexer 216, in operation, provides an output signal corresponding to a selected one of the signal D received at the first input of the multiplexer 216 and the signal TI received at the second input of the multiplexer 216. The output of the multiplexer 216, in operation, is inverted by the optional inverter 218 of the mode selection circuit 204 when the flip-flop has an inverter output (QN) configuration. In a non-inverted output configuration, the inverter 218 of the mode selection circuit 204 may be omitted. The mode selection circuit 204 may be omitted if the scan feature is not required: the input D may be connected to the input of inverter 218 for Q configuration, or to the gate of transistor 224 for QN configuration.

The latch circuitry 206 of the flip-flop 200 of FIG. 2, as illustrated, is a pulse-controlled latch circuit and comprises a first latch stack 208 comprising a P-Type Metal Oxide Semiconductor (PMOS) field effect transistor 220 coupled between a supply line or node 250 and a first latch stack output node 252, and a first N-Type Metal Oxide Semiconductor (NMOS) field effect transistor 222 coupled in series with a second NMOS transistor 224 between the first latch stack output node 252 and a ground line or node 254. The gate of the PMOS transistor 220 is coupled to an output of the second inverter 214 of the pulse generation circuit 202 to receive the signal CPI. The gate of the first NMOS transistor 222 is coupled to the output of the NOR gate 210, and the gate of the second NMOS transistor 224 is coupled to the output of the mode selection circuit 204 to receive an inverted version of the selected one of the signal D received at the first input of the multiplexer 216 and the signal TI received at the second input of the multiplexer 216. In a non-inverted output configuration, the gate of the second NMOS transistor 224 is coupled to the output of the mode selection circuit 204 to receive the selected one of the signal D received at the first input of the multiplexer 216 and the signal TI received at the second input of the multiplexer 216.

An input of an inverter 272 is coupled to the first latch stack output node 252, and an output of the inverter 272 is coupled to a data input of a pulse-clocked inverter 274. The output of the pulse-clocked inverter 274 is coupled to the first stack output node 252. A clock input of the pulse-clocked inverter 274 is coupled to the output of the NOR gate 210 to receive pulses generated by the pulse generation circuitry 202. The inverter 272 and the pulse-clocked inverter 274 together form a pulse controlled sample circuit 275.

The latch circuitry 206 comprises a second latch stack 226 comprising a PMOS transistor 228 coupled between the supply line or node 250 and a second latch stack output node 256, and a first NMOS transistor 230 coupled in series with a second NMOS transistor 232 between the second latch stack output node 256 and the ground line or node 254. The gate of the PMOS transistor 228 is coupled to the output node 252 of the first latch stack 208. The gate of the first NMOS transistor 230 is coupled to the output of the second inverter 214 of the pulse generation circuit 202 to receive the signal CPI. The gate of the second NMOS transistor 232 is coupled to the first latch stack 208 output node 252. An input of an inverter 242 is coupled to the second latch stack output node 256.

The latch circuitry 206 comprises a third latch stack 234 comprising a first PMOS transistor 236 coupled in series with a second PMOS transistor 238 between the supply line or node 250 and the second latch stack output node 256, and an NMOS transistor 240 coupled between the second latch stack output node 256 and an intermediate node 248 coupling the first NMOS transistor 230 and the second NMOS transistor 232 of the second latch stack 226 together. A gate of the first PMOS transistor 236 is coupled to an output of the inverter 242. A gate of the second PMOS transistor 238 is coupled to the output of the second inverter 214 of the pulse generation circuit 202 to receive the signal CPI. A gate of the NMOS transistor 240 is coupled to the output of the inverter 242.

The latch circuitry comprises an output stack 243 or inverter comprising a PMOS transistor 244 coupled in series with an NMOS transistor 246 between the supply line or node 250 and the ground line or node 254. An intermediate node 258 of the output stack 243 between the PMOS transistor 244 and the NMOS transistor 246 provides an output QN of the flip-flop 200, or an output Q if the inverter 218 is omitted.

In operation, when the clock signal CP is low, the first latch stack output node 252 is precharged at high value by the transistor 220, and maintained by the inverters 272 and 274 loop.

At the clock CP rising edge, a pulse is generated by the pulse generation circuit 202. In response to the generated pulse, the output of the inverter 274 is gated during the pulse time, and the value corresponding to the control signal received at the gate of the transistor 224 by the output of the mode selection circuit 204, or D input when the scan feature is removed, is transferred to the first latch stack output node 252. The signal output by the mode selection circuit 204 is determined by the value of input TE, that is, for example, enabling D input when low, or TI input when high.

When the value received at the gate of the transistor 224 is high, the transistor 224 discharges the first latch stack output node 252, enabling the transistor 228 to generate a high value at the second latch stack output node 256. The inverter 243 then outputs the inverted second latch stack output node 256 value. When the value received at the gate of transistor 224 is low, the transistor 224 remains gated, the first latch stack output node 252 remains at the precharged high value, enabling the transistor 232 to generate a low value at the second latch stack output node 256, which is transferred to the second latch stack output node 256 through transistor 230.

When the clock signal is low, the third latch stack 234 maintains the second latch stack output node 256 value, and therefore the Q or QN output value. The third latch stack 234 is gated when the clock signal is high, allowing the previously described operation.

An embodiment of the flip-flop 200 of FIG. 2 facilitates lowering setup times, providing negative hold time, improving the balance between the hold rise/fall and the setup rise/fall, reducing delay times and reducing the area needed to implement flip-flops by reducing the number of transistor in stacks of the latch circuitry, as compared to conventional scan-controlled semi-dynamic flip-flops and conventional hybrid latch flip-flops. An embodiment also facilitates reducing the average leakage power and the average internal energy, as compared to conventional scan-controlled semi-dynamic flip-flops and conventional hybrid latch flip-flops.

Figure 3:
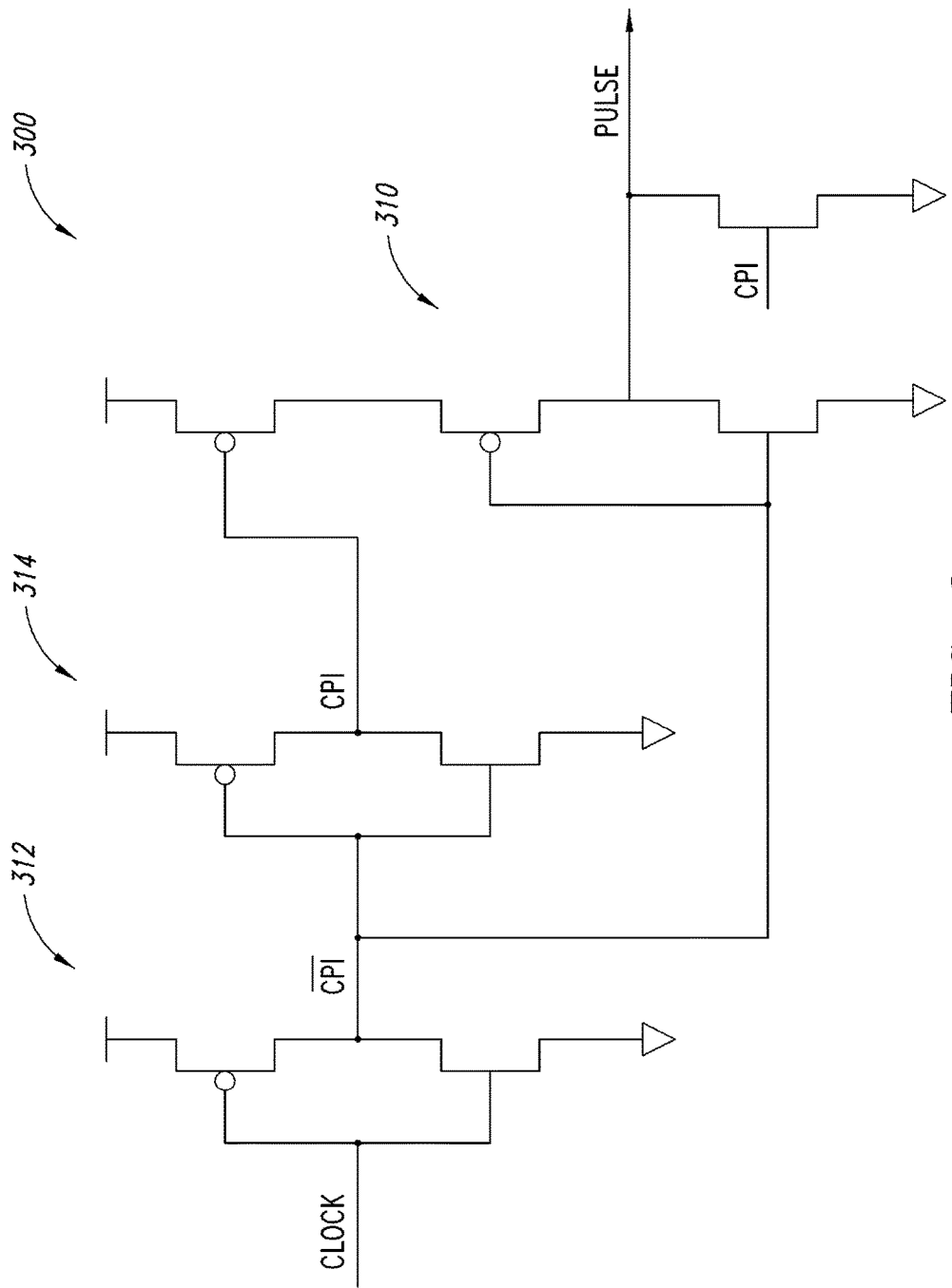
FIG. 3 illustrates an embodiment of a pulse generation circuit that may be employed in the embodiment of a flip-flop of FIG. 2.

FIG. 3 illustrates an example CMOS implementation of an embodiment of a pulse generation circuit 300 that may be employed in the embodiment of a flip-flop of FIG. 2. The pulse generation circuit 300 comprises a NOR gate 310, a first inverter 312 which in operation receives a clock signal and a second inverter 314 which in operation receives an output signal of the first inverter 312. The NOR gate 310 receives the outputs of the first inverter 312 and the second inverter 314 at respective inputs of the NOR gate 310. Other implementations, including other CMOS implementations, of a pulse generation circuit using a NOR gate to generate the pulse signal may be employed.

Figure 4:
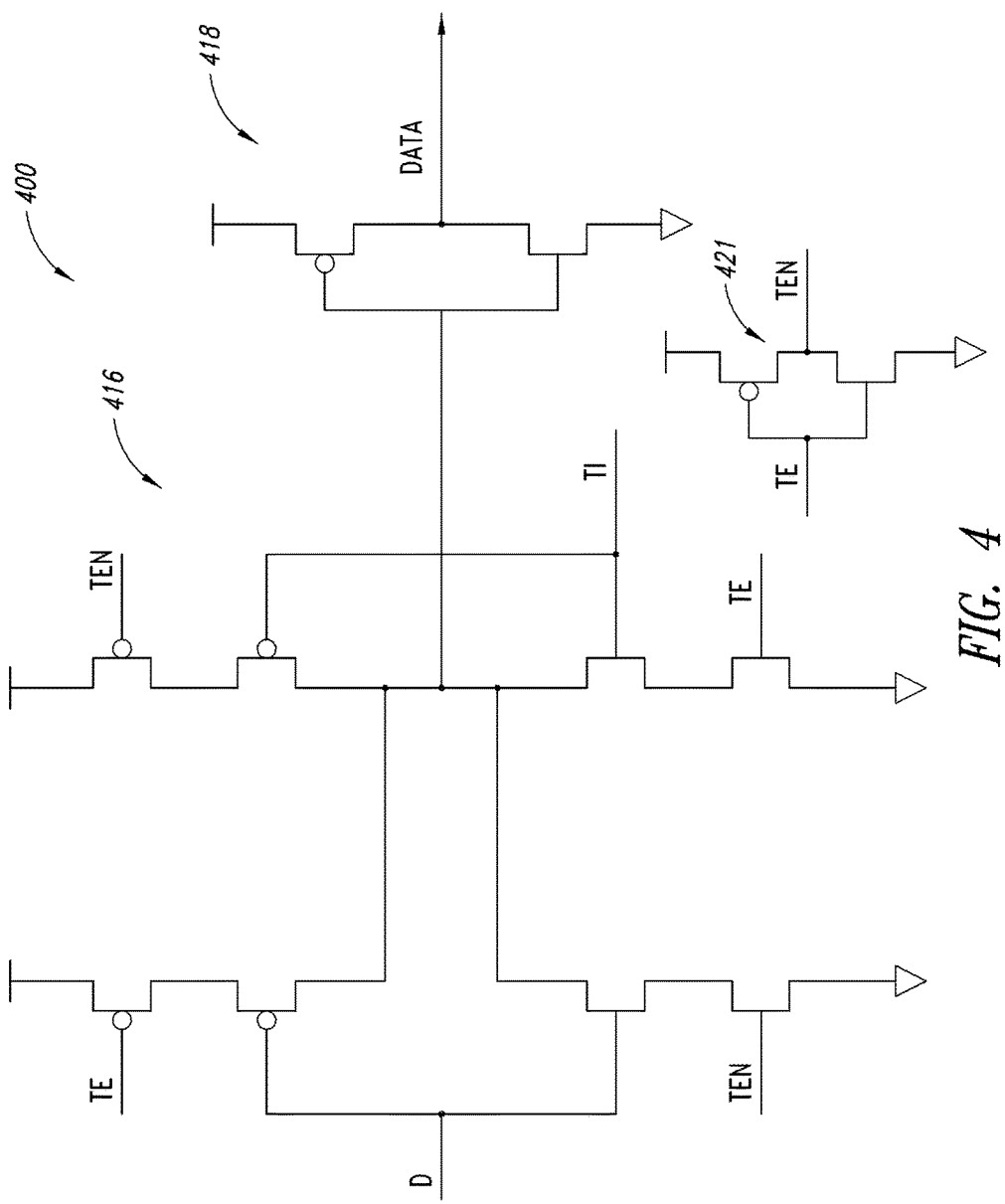
FIG. 4 illustrates an embodiment of a mode selection circuit that may be employed in the embodiment of a flip-flop of FIG. 2.

FIG. 4 illustrates an example CMOS implementation of an embodiment of a mode selection circuit 400 that may be employed in the embodiment of a flip-flop of FIG. 2. The mode selection circuit 400 comprises a multiplexer 416. The multiplexer 416 has a first input which in operation receives a signal D, which may be, for example, a data signal, such as a signal generated during normal operation of a digital circuit (see digital circuit 102 of FIG. 1) including one or more flip-flops. The multiplexer 416 has a second input which in operation receives a signal TI, which may be, for example, a test input signal of a scan mode of operation of a digital circuit (see digital circuit 102 of FIG. 1) including the flip-flop. The multiplexer 416 has a selection input which in operation receives a selection signal TE, which may be, for example, a test enable signal of a digital circuit (see digital circuit 102 of FIG. 1) including the flip-flop, a scan enable signal, etc. In response to the selection signal TE, the multiplexer 416, in operation, provides an output signal corresponding to a selected one of the signal D received at the first input of the multiplexer 416 and the signal TI received at the second input of the multiplexer 416. The output of the multiplexer 416, in operation, is inverted by the optional inverter 418 of the mode selection circuit 400 when the flip-flop has an inverted output (QN) configuration. In a non-inverted output configuration, the inverter 418 of the mode selection circuit 400 may be omitted. As illustrated, the multiplexer 416 generates a signal TEN (NOT TE) using an inverter 421. Other implementations, including other CMOS implementations, of a mode selection circuit having a multiplexer may be employed.

Figure 5:
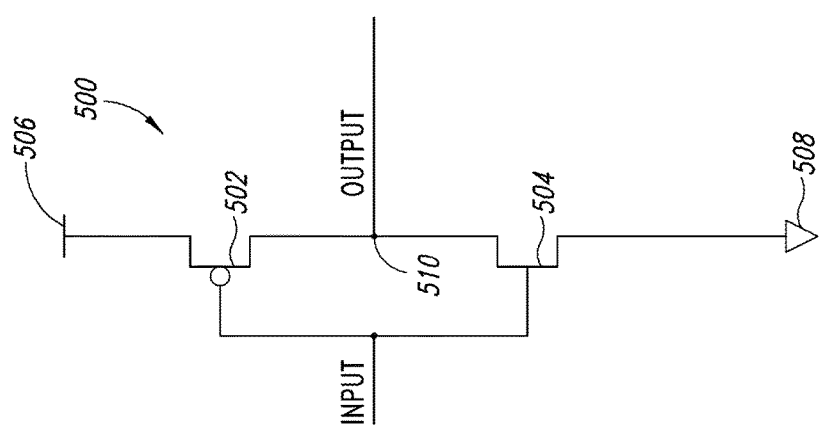
FIG. 5 illustrates an embodiment of an inverter that may be employed in the embodiment of the flip-flop of FIG. 2.

FIG. 5 illustrates an example CMOS implementation of an embodiment of an inverter 500 that may be employed in the embodiment of the flip-flop of FIG. 2 (see inverters 212, 214, 218, 242 and 272). The inverter 500 comprises a PMOS transistor 502 and an NMOS transistor 504 coupled together in series between a supply line or node 506 and a ground line or node 508. The gates of the PMOS transistor 502 and of the NMOS transistor 504 are coupled to an input node, and in operation receive an input signal INPUT to be inverted. In operation, an output signal OUTPUT, which is an inverted input signal (NOT INPUT) is provided at an output node 510. Other implementations, including other CMOS implementations, of an inverter may be employed.

Figure 6:
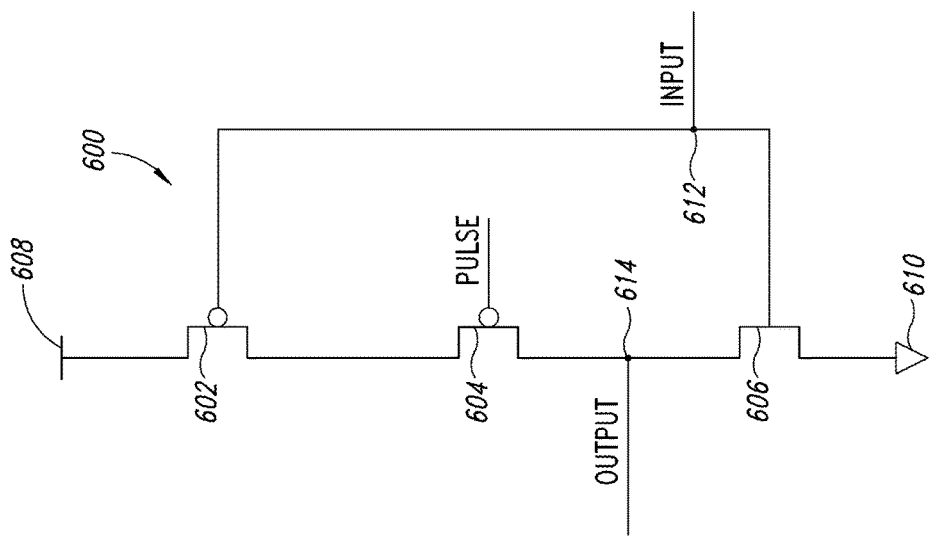
FIG. 6 illustrates an embodiment of a pulse-clocked inverter that may be employed in the embodiment of the flip-flop of FIG. 2.

FIG. 6 illustrates an example CMOS implementation of an embodiment of a pulse-clocked inverter 600 that may be employed in the embodiment of the flip-flop of FIG. 2 (see clocked inverter 274). The pulse-clocked inverter 600 comprises a first PMOS transistor 602, a second PMOS transistor 604 and an NMOS transistor 606 coupled together in series between a supply line or node 608 and a ground line or node 610. The gates of the first PMOS transistor 602 and of the NMOS transistor 606 are coupled to an input node 612, and in operation receive an input signal INPUT to be inverted. For example, with reference to FIG. 2, an embodiment may receive an output signal generated by the inverter 272. The gate of the second PMOS transistor 604, in operation, receives a clock pulse signal. For example, with reference to FIG. 2, an embodiment may receive a clock pulse signal output by the pulse generator circuit 202. Other implementations, including other CMOS implementations, of a pulse-clocked inverter may be employed.

Figure 7:
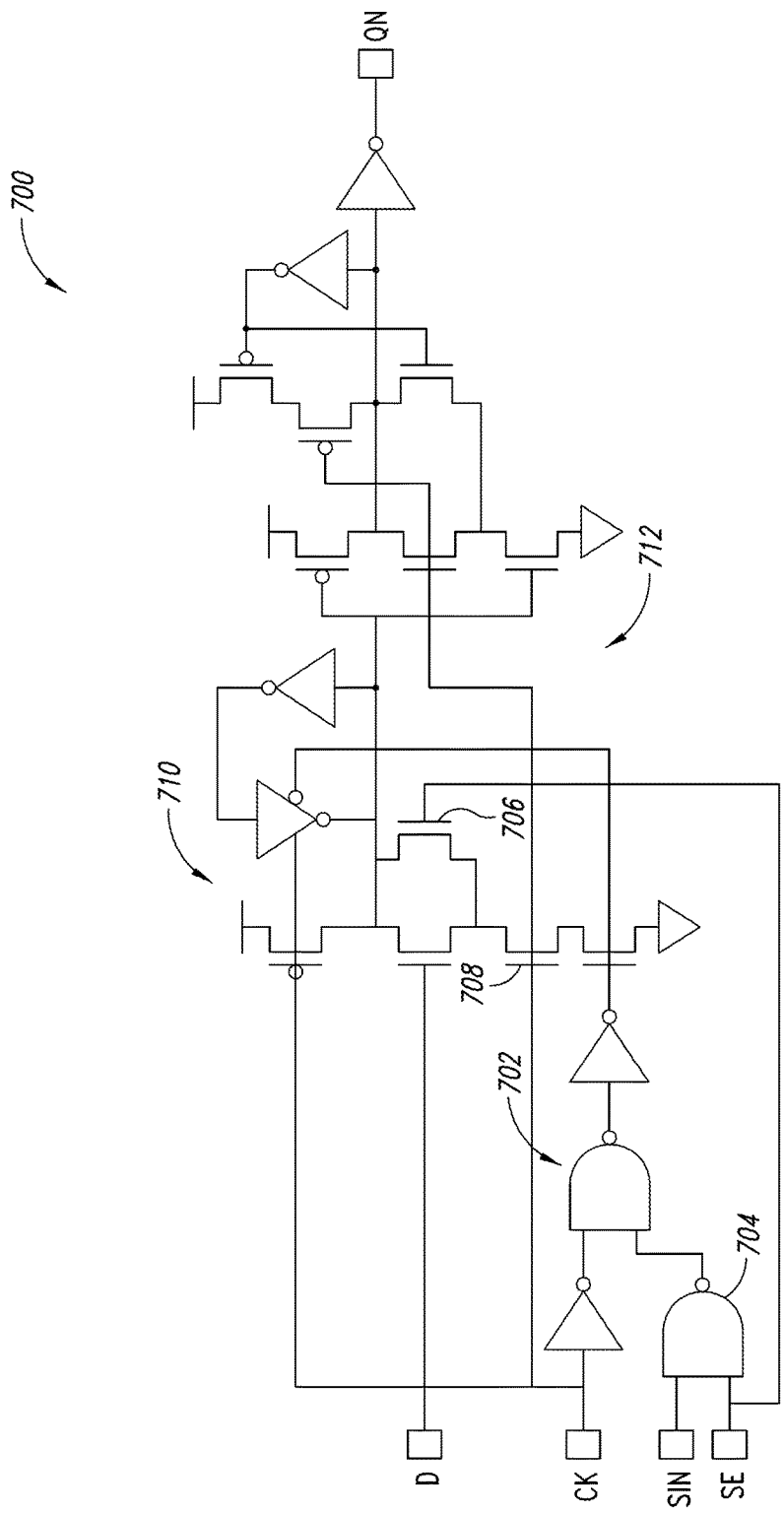
FIG. 7 illustrates a scan-controlled flip-flop employing inverter-NAND-based pulse generation.
Figure 8:
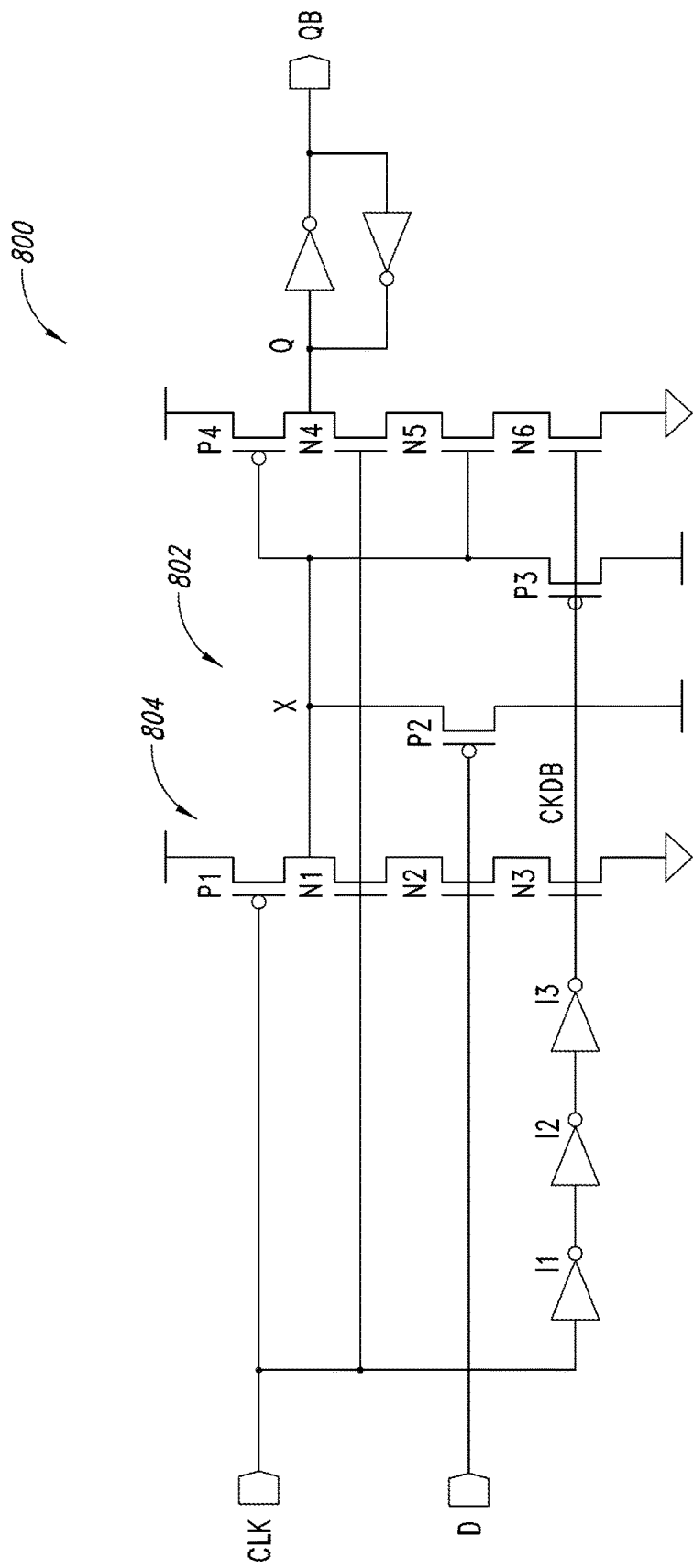
FIG. 8 illustrates hybrid latch flip-flop.

FIG. 7 illustrates a flip-flop 700 employing inverter-NAND-based pulse generation. The pulse generation circuitry 702 comprises inverters and a NAND gate, and the mode selection circuitry comprises a NAND gate 704. Two additional transistors 706 and 708 are required in the first stack 710 of the latch circuit 712, as compared to the first stack 208 of the latch circuit 206 of FIG. 2. FIG. 8 illustrates a hybrid latch flip-flop 800. The first stack 804 of the latch circuit 802 requires four transistors, and the flip-flop 800 is not scan-enabled.

The various embodiments described above can be combined to provide further embodiments. Aspects of the embodiments can be modified, if necessary to employ concepts of the various patents, applications and publications to provide yet further embodiments.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a pulse generator circuit including:
      a first inverter having an input coupled to a clock signal input node;
      a second inverter having an input coupled to an output of the first inverter and an output, which in operation, provides a delayed clock signal; and
      a NOR gate having a first input coupled to an output of the first inverter, a second input coupled to the output of the second inverter, and an output, which, in operation, provides a pulse signal in response to a rising edge of a clock signal received at the clock signal input node; and a pulse-controlled latch circuit including:
   a clock input coupled to the output of the second inverter;
   a pulse-signal input coupled to the output of the NOR gate;
   a data input node;
   a first latch stack coupled between a supply node and a ground node and having a first CMOS transistor having a gate coupled to the output of the second inverter, a second CMOS transistor having a gate coupled to the output of the NOR gate, a third CMOS transistor having a gate coupled to the data input node of the pulse-controlled latch circuit, and a first latch stack output node; and
   a second latch stack coupled between the supply node and the ground node and having a first CMOS transistor having a gate coupled to the output node of the first latch stack, a second CMOS transistor having a gate coupled to the output of the second inverter of the pulse generator circuit, a third CMOS transistor having a gate coupled to the output node of the first latch stack, and a second latch stack output node.

2. The device of claim 1, comprising:
a mode selection circuit comprising a multiplexer having a first input node, a second input node, a selection input node, and an output node coupled to the data input node of the pulse-controlled latch circuit, wherein, in operation, the multiplexer outputs at the output node a selected one of a signal received at the first input node and a signal received at the second input node based on a signal received at the selection input node.

3. The device of claim 2 wherein the mode selection circuit comprises an inverter coupled between the output of the multiplexer and the data input node of the pulse-controlled latch circuit.

4. The device of claim 2 wherein the pulse generator circuit comprises a first plurality of CMOS transistors, the mode selection circuit comprises a second plurality of CMOS transistors, and the pulse-controlled latch circuit comprises a third plurality of CMOS transistors.

5. The device of claim 2 wherein the signal received at the selection input node is a signal indicative of a scan mode of operation of the device.

6. The device of claim 1 wherein,
the first CMOS transistor is a PMOS transistor coupled between the supply node and the first latch stack output node,
the second CMOS transistor is an NMOS transistor coupled between the first latch stack output node and the third CMOS transistor, and
the third CMOS transistor is an NMOS transistor coupled between the second CMOS transistor and the ground node.

7. The device of claim 6 wherein the pulse-controlled latch circuit comprises a pulse-controlled sampling circuit having a first inverter and a pulse-clocked inverter coupled in series to the output node of the first latch stack in a loop configuration.

8. The device of claim 1 wherein the pulse-controlled latch circuit comprises a pulse-controlled sampling circuit having a first inverter and a pulse-clocked inverter coupled in series to the output node of the first latch stack in a loop configuration.

9. The device of claim 1 wherein the first CMOS transistor of the second latch stack is a PMOS transistor coupled between the supply node and the second latch stack output node, the second CMOS transistor of the second latch stack is an NMOS transistor coupled between the second latch stack output node and the third CMOS transistor of the second latch stack and the third CMOS transistor of the second latch stack is an NMOS transistor coupled between the second CMOS transistor of the second latch stack and the ground node.

10. The device of claim 1 wherein the pulse-controlled latch circuit comprises a third latch stack coupled between the supply node and an intermediate node of the second latch stack and an inverter coupled between the output node of the second latch stack and an input node of the third latch stack, the third latch stack including a first CMOS transistor having a gate coupled to the input node of the third latch stack, a second CMOS transistor having a gate coupled to the output of the second inverter of the pulse generator circuit and a third CMOS transistor having a gate coupled to the input node of the third latch stack.

11. The device of claim 10 wherein the first CMOS transistor of the third latch stack is a PMOS transistor coupled between the supply node and the second CMOS transistor of the third latch stack, the second CMOS transistor of the third latch stack is a PMOS transistor coupled between the first CMOS transistor of the third latch stack and the third CMOS transistor of the third latch stack and the third CMOS transistor of the third latch stack is an NMOS transistor coupled between the second CMOS transistor of the third latch stack and the intermediate node of the second latch stack.

12. The device of claim 10 wherein the pulse-controlled latch circuit comprises an inverter coupled between the output node of the second latch stack and an output node of the pulse-controlled latch circuit.

13. A system, comprising:
a plurality of flip-flops, each flip-flop of the plurality of flip-flops having:
   a pulse generator circuit including:
      a first inverter having an input coupled to a clock signal input node;
      a second inverter having an input coupled to an output of the first inverter and an output, which in operation, provides a delayed clock signal; and
      a NOR gate having a first input coupled to an output of the first inverter, a second input coupled to the output of the second inverter, and an output, which, in operation, provides a pulse signal in response to a rising edge of a clock signal received at the clock signal input node; and
   a pulse-controlled latch circuit including:
      a clock input coupled to the output of the second inverter;
      a pulse-signal input coupled to the output of the NOR gate;
      a data input node;
      a first latch stack coupled between a supply node and a ground node and having a first CMOS transistor having a gate coupled to the output of the second inverter, a second CMOS transistor having a gate coupled to the output of the NOR gate, a third CMOS transistor having a gate coupled to the data input node of the pulse-controlled latch circuit, and a first latch stack output node; and
      a second latch stack coupled between the supply node and the ground node and having a first CMOS transistor having a gate coupled to the output node of the first latch stack, a second CMOS transistor having a gate coupled to the output of the second inverter of the pulse generator circuit, a third CMOS transistor having a gate coupled to the output node of the first latch stack, and a second latch stack output node.

14. The system of claim 13 wherein at least one of the plurality of flip-flops comprises a mode selection circuit including a multiplexer having a first input node, a second input node, a selection input node, and an output node, wherein, in operation, the multiplexer outputs at the output node a selected one of a signal received at the first input node and a signal received at the second input node based on a signal received at the selection input node.

15. The system of claim 14 wherein a mode selection circuit of one of the at least one of the plurality of flip-flops comprises an inverter coupled between the output of the multiplexer and the data-input of the pulse-controlled latch circuit.

16. The system of claim 15, comprising a scan chain including one or more of the at least one of the plurality of flip-flops.

17. The system of claim 13, comprising a processor core including one or more of the plurality of flip-flops.

18. The system of claim 13, comprising an integrated circuit including the plurality of flip-flops.

19. The system of claim 13, comprising one or more additional flip-flops.

20. A method, comprising:
inverting, using a first inverter, a clock signal, generating an inverted clock signal;
inverting, using a second inverter, the inverted clock signal, generating a delayed clock signal;
applying, using a NOR gate, a logical NOR operation to the inverted clock signal and the delayed clock signal, generating a pulse signal; and
controlling latching of a signal by a pulse-controlled latch circuit based on the delayed clock signal and the pulse signal, wherein the pulse-controlled latch circuit includes:
a first latch stack coupled between a supply node and a ground node and having a first CMOS transistor having a gate coupled to the output of the second inverter, a second CMOS transistor having a gate coupled to the output of the NOR gate, a third CMOS transistor having a gate coupled to a data input node of the pulse-controlled latch circuit, and a first latch stack output node; and
a second latch stack coupled between the supply node and the ground node and having a first CMOS transistor having a gate coupled to the output node of the first latch stack, a second CMOS transistor having a gate coupled to the output of the second inverter of the pulse generator circuit, a third CMOS transistor having a gate coupled to the output node of the first latch stack, and a second latch stack output node.

21. The method of claim 20, comprising:
selecting, using a multiplexer, one of a first input signal and a second input signal based on a mode selection signal, wherein the controlling latching comprises controlling latching of a signal corresponding to the selected one of the first input signal and the second input signal.

22. The method of claim 21, comprising inverting, using an inverter, the selected one of the first input signal and the second input signal, generating the signal corresponding to the selected one of the first input signal and the second input signal.

23. The method of claim 21 wherein the signal corresponding to the selected one of the first input signal and the second input signal is equal to the selected one of the first input signal and the second input signal.

24. The method of claim 21 wherein the mode selection signal indicates one of a data input mode of operation and a scan mode of operation.

* * * * *